United States Patent
Sazhin et al.

(10) Patent No.: US 10,036,779 B2
(45) Date of Patent: Jul. 31, 2018

(54) SYSTEMS AND RELATED METHODS FOR DETERMINING SELF-DISCHARGE CURRENTS AND INTERNAL SHORTS IN ENERGY STORAGE CELLS

(71) Applicant: BATTELLE ENERGY ALLIANCE, LLC., Idaho Falls, ID (US)

(72) Inventors: Sergiy V Sazhin, Idaho Falls, ID (US); Eric J Dufek, Ammon, ID (US); Kevin L Gering, Idaho Falls, ID (US)

(73) Assignee: Battelle Energy Alliance, LLC, Idaho Falls, ID (US)

( * ) Notice: Subject to any disclaimer, the term of this patent is extended or adjusted under 35 U.S.C. 154(b) by 188 days.

(21) Appl. No.: 14/954,446

(22) Filed: Nov. 30, 2015

(65) Prior Publication Data
US 2017/0153290 A1  Jun. 1, 2017

(51) Int. Cl.
| | |
|---|---|
| *G01N 27/416* | (2006.01) |
| *G01R 31/36* | (2006.01) |
| *G01R 31/00* | (2006.01) |
| *G01R 31/02* | (2006.01) |

(52) U.S. Cl.
CPC ....... *G01R 31/3606* (2013.01); *G01R 31/003* (2013.01); *G01R 31/025* (2013.01); *G01R 31/3648* (2013.01); *G01R 31/3658* (2013.01)

(58) Field of Classification Search
CPC .............. G01R 31/3606; G01R 31/003; G01R 31/025; G01R 31/3648; G01R 31/3658
USPC ........................................................ 324/434
See application file for complete search history.

(56) References Cited

U.S. PATENT DOCUMENTS

| | | |
|---|---|---|
| 5,214,385 A | 5/1993 | Gabriel et al. |
| 5,565,759 A | 10/1996 | Dunstan |
| 5,606,242 A | 2/1997 | Hull et al. |
| 5,640,081 A | 6/1997 | Austin et al. |
| 7,683,575 B2 | 3/2010 | Berdichevsky et al. |

(Continued)

FOREIGN PATENT DOCUMENTS

WO   2013009696 A1   1/2013

OTHER PUBLICATIONS

International Search Report from International Application No. PCT/US2016/062007, dated Feb. 7, 2017, 2 pages.

(Continued)

*Primary Examiner* — Nathaniel Pelton
(74) *Attorney, Agent, or Firm* — TraskBritt

(57) ABSTRACT

Systems and methods for determining self-discharge currents in an energy storage cell and detecting internal shorts are disclosed. A system includes a DC voltage source configured to provide a constant test voltage selected to be less than an open-circuit voltage of an energy storage cell to the energy storage cell. The system also includes a current measuring device operably coupled between the DC voltage source and the energy storage cell, and control circuitry operably coupled to the current measuring device. A method includes applying the constant test voltage, and measuring the test current flowing between the DC voltage source and the energy storage cell until after the test current switches from a negative current to a positive current. The method also includes determining a self-discharge current of the energy storage cell by analyzing the measured test current with computational models that capture physical processes tied to the test methods.

31 Claims, 7 Drawing Sheets

(56) References Cited

U.S. PATENT DOCUMENTS

| | | | |
|---|---|---|---|
| 7,795,843 B2 | 9/2010 | Keates et al. | |
| 7,902,828 B2 | 3/2011 | Huang | |
| 8,643,332 B2 | 2/2014 | Yokotani | |
| 2001/0033169 A1* | 10/2001 | Singh | G01R 31/3662 324/426 |
| 2003/0214303 A1 | 11/2003 | Ying | |
| 2006/0017444 A1* | 1/2006 | Fechalos | G01R 31/3668 324/433 |
| 2011/0298417 A1* | 12/2011 | Stewart | G01R 31/025 320/107 |
| 2011/0301931 A1* | 12/2011 | Gering | G01R 31/3679 703/13 |
| 2014/0121866 A1* | 5/2014 | Dangler | H02J 7/0029 701/22 |
| 2014/0266229 A1 | 9/2014 | McCoy | |

OTHER PUBLICATIONS

International Written Opinion from International Application No. PCT/US2016/062007, dated Feb. 7, 2017, 12 pages.

Notten et al., "Battery Modeling: A versatile Tool to Design Advanced Battery Management Systems", Advances in Chemical Engineering and Science, 4, 62-72 (2014).

Tarnopolskiy et al., "Beneficial influence of succinic anhydride as electrolyte additive on the self-discharge of 5 V Li Ni0.4 Mn1.6 O4 cathodes", Journal of Power Sources 236, 39-46 (2013).

Niu et al., "Comparative studies of self-discharge by potential decay and float-current measurements at C double-layer capacitor and battery electrodes", Journal of Power Sources 135, 332-343 (2004).

Bandhauer et al., "A Critical Review of Thermal Issues in Lithium-Ion Batteries", Journal of The Electrochemical Society: Critical Reviews in Electrochemical and Solid-State Science and Technology, 158 (3) R1-R25 (2011).

Rosso et al., "Dendrite short-circuit and fuse effect on Li/polymer/Li cells", Electrochimica Acta 51, 5334-5340 (2006).

Mikolajczak et al., "Detecting Lithium-Ion Cell Internal Faults in Real Time", http//powerelectronics.com/mobile/detecting-lithium-ion-cell-internal-faults-in-real-time (Mar. 2010) 6 pages.

Conway et al., "Diagnostic analyses for mechanisms of self-discharge of electrochemical capacitors and batteries", Journal of Power Sources 65, 53-59 (1997).

Zimmerman, "Self-Discharge Losses in Lithium-Ion Cells", The Aerospace Corporation, IEEE AESS Systems Magazine, (Feb. 2004) 24 pages.

Wang et al., "Self-discharge of secondary lithium-ion graphite anodes", Journal of Power Sources 112, 98-104 (2002).

Zhang et al., "Electrochemical investigation of $CrO_{2.65}$ doped Li $Mn_2 O_4$ as a cathode material for lithium-ion batteries", Journal of Power Sources 76, 81-90 (1998).

Conway, "Electrochemical Supercapacitors", Scientific Fundamentals and Technological Applications, Kluwer Academic/Plenum Publishers New York, Boston, Dordrecht, London, Moscow, Chapter 18, pp. 557-569 (1999).

Orendorff et al., "Experimental triggers for internal short circuits in lithium-ion cells", Journal of Power Sources 196, 6554-6558 (2011).

Utsunomiya et al., "Influence of particle size on the self-discharge behavior of graphite electrodes in lithium-ion batteries", Journal of Power Sources 196, 8675-8682 (2011).

Maleki et al., "Internal short circuit in Li-ion cells", Journal of Power Sources 191, 568-574 (2009).

Santhanagopalan et al., "Analysis of internal short-circuit in a lithium ion cell", Journal of Power Sources 1994, 550-557 (2009).

Yazami et al., "A kinetics study of self-discharge of spinel electrodes in Li/Li$_x$ Mn$_2$ O$_4$ cells", Journal of Power Sources 153, 251-257 (2006).

Mikolajczak et al., "Lithium-Ion Batteries Hazard and Use Assessment", The Fire Protection Research Foundation (Jul. 2011) 126 pages.

McCoy et al., "Lithium-Ion Battery Safety: Detection of Developing Internal Shorts and Suppression of Thermal Runaway", www.camxpower.com/wp-content/uploads/4-6.pdf, downloaded from internet Nov. 2015, 4 pages.

Yazami et al., "Mechanism of self-discharge in graphite-lithium anode", Electrochimica Acta 47, 1217-1223 (2002).

Yu et al., "Ni-Composite Microencapsulated Graphite as the Negative Electrode in Lithium-Ion Batteries", Journal of the Electrochemical Society, 147 (6), 2081-2085 (2000).

Sloop et al, "The role of Li-ion battery electrolyte reactivity in performance decline and self-discharge", Journal of Power Sources 119-121, 330-337 (2003).

White et al., "Safety and Preventing Thermal Run Away in Large Li-Ion Batteries", http://www.batterypoweronline.com/main/markets/testingservices/safety-and-preventing-thermal-run-away-in-large-li-ion-batteries (Jun. 2012) 3 pages.

White et al., "Safety & Reliability Capabilities of Lithium-Ion Battery Systems for Subsea Applications That Use Autonomous Lithium-Ion Battery Modules", http://www.swe.com/media/files/files/1087929c/2013_07_26_Oceans_2013_Paper_David_White_SWE_PID2876057.pdf, downloaded from the internet Nov. 2015, 9 pages.

Ramasamy et al., "Simulation of capacity loss in carbon electrode for lithium-ion cells during storage", Journal of Power Sources 166, 266-272 (2007).

* cited by examiner

SYSTEMS AND RELATED METHODS FOR DETERMINING SELF-DISCHARGE CURRENTS AND INTERNAL SHORTS IN ENERGY STORAGE CELLS

STATEMENT REGARDING FEDERALLY SPONSORED RESEARCH OR DEVELOPMENT

The invention was made with government support under Contract No. DE-AC07-05-ID14517, awarded by the United States Department of Energy. The government has certain rights in this invention.

BACKGROUND

The present disclosure relates to systems and methods for determining health parameters of energy storage cells and, more specifically, to self-discharge determination in energy storage cells (e.g., employed in rechargeable service), as well as systems including such cells.

Rechargeable batteries are used in many devices, including cars and portable consumer electronics. Demand for higher and higher energy density rechargeable batteries with smaller and smaller self-discharge in these devices, among other things, has brought lithium-ion batteries to prominence (lithium-ion batteries typically have relatively high energy density and relatively low self-discharge compared to most other known battery chemistries).

One drawback of lithium-ion batteries, however, is their potential to catch fire and/or explode. For example, internal soft short circuits (ISSCs) in a lithium-ion battery may develop, and may eventually transform into internal hard short circuits (IHSCs). Heat generated from elevated self-discharge current through IHSCs may cause unpredictable catastrophic failures due to thermal runaway of the lithium-ion battery, in which the battery may smoke (emitting toxic vapors), catch fire, explode, or combinations thereof. Aside from the safety issues resulting from these catastrophic failures in lithium-ion batteries, catastrophic failures have also resulted in large-scale recalls costing hundreds of millions of dollars and damaging provider reputations. As size of batteries in rechargeable battery systems increases (e.g., in electric drive vehicles), or stationary storage (e.g., grid storage) the concern for catastrophic failures also increases.

Formation of ISSCs and IHSCs may be accompanied by an increase in self-discharge of batteries. Conventional methods to measure self-discharge in batteries, however, are time intensive. Some of them require full charge-discharge cycling of the battery with long rest between charging and discharging operations, others use relatively long rest time to allow battery equilibration to a state of charge (SOC) of interest before measuring self-discharge. None of conventional methods use a pure self-discharge metric, which is separated from other parallel processes in the cell (e.g., redistribution of Li cations in the Li-ion battery due to faradaic and diffusion processes). These conventional methods are not practical for many applications because of the length of time required to perform them and uncertainty in self-discharge definitions and measurements. Furthermore, these conventional methods are generally only capable of detecting IHSCs, not ISSCs. Detection of IHSCs in batteries may be of limited value because catastrophic failures may be imminent and difficult or impossible to prevent by the time IHSCs form.

BRIEF SUMMARY

Disclosed in some embodiments herein is a method of determining a self-discharge current in an energy storage cell. The method includes applying, with a direct current (DC) voltage source, a constant test voltage to an energy storage cell. The constant test voltage is less than an open-circuit voltage of the energy storage cell at an initial state of charge (SOC) of the energy storage cell. The method also includes measuring a test current flowing between the DC voltage source and the energy storage cell until after the test current switches from a negative current to a positive current. The method further includes determining, with control circuitry operably coupled to the current measuring device, a self-discharge current of the energy storage cell by analyzing the measured test current.

Disclosed in some embodiments herein is a system for determining a self-discharge current of one or more energy storage cells. The system includes a DC voltage source configured to provide a constant test voltage to one or more energy storage cells. The constant test voltage is selected to be less than an open circuit voltage of the one or more energy storage cells. The system also includes a current measuring device operably coupled between the DC voltage source and the one or more energy storage cells. The current measuring device is configured to measure a test current flowing between the DC voltage source and the one or more energy storage cells. The system further includes control circuitry operably coupled to the current measuring device. The control circuitry is configured to determine a self-discharge current of the one or more energy storage cells by analyzing the test current measured by the current measuring device. The system also includes a user interface configured to indicate at least one of the determined self-discharge current of the one or more energy storage cells and a health parameter of the one or more energy storage cells generated from the determined self-discharge current determined by the control circuitry.

DETAILED DESCRIPTION

Figure 1:
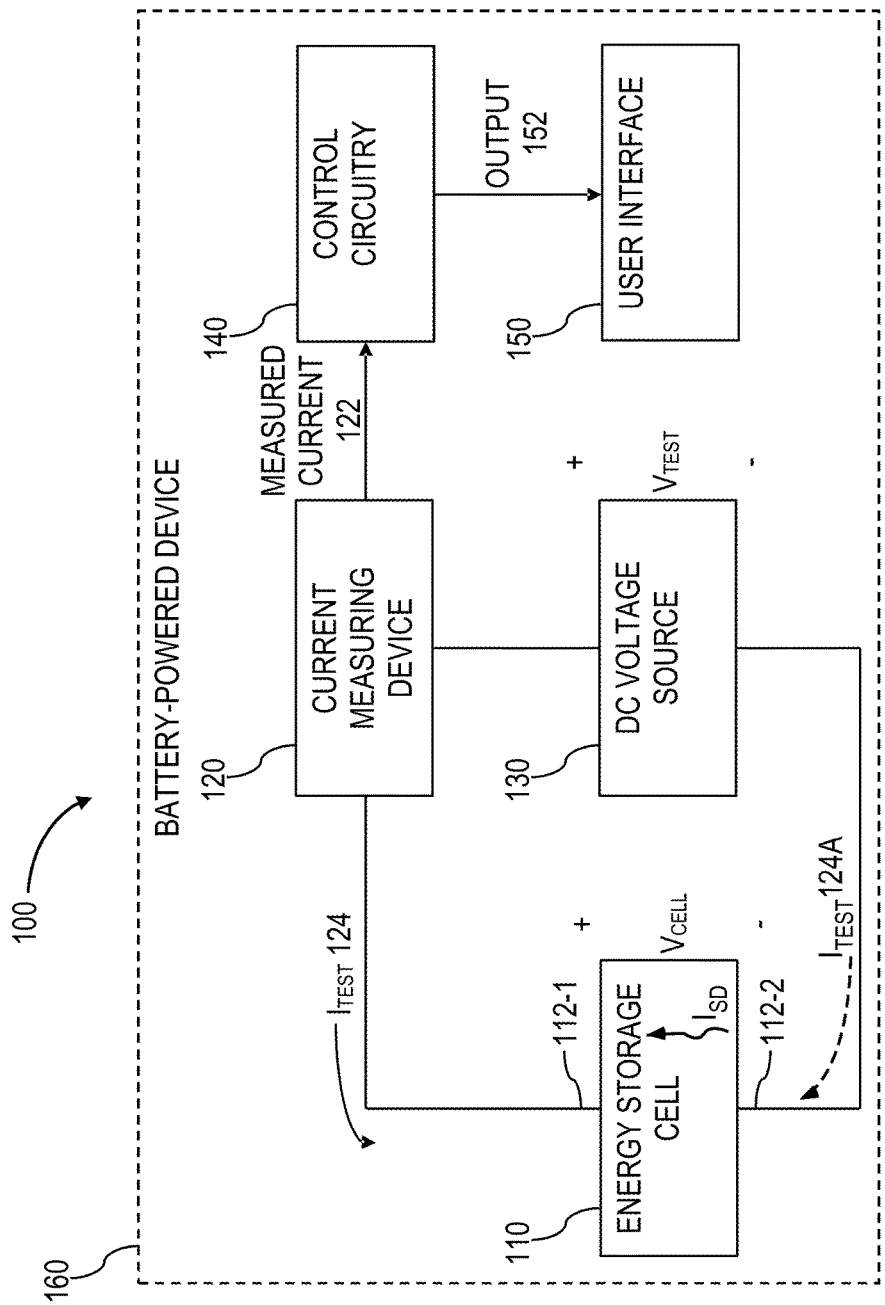
FIG. 1 is a simplified block diagram of a system for determining a self-discharge current of one or more energy storage cells.

In the following detailed description, reference is made to the accompanying drawings, which form a part hereof, and in which is shown by way of illustration specific embodiments in which the present disclosure may be practiced. These embodiments are described in sufficient detail to enable those of ordinary skill in the art to practice the present disclosure. It should be understood, however, that the detailed description and the specific examples, while indicating examples of embodiments of the present disclosure, are given by way of illustration only and not by way of limitation. From this disclosure, various substitutions, modifications, additions rearrangements, or combinations thereof within the scope of the present disclosure may be made and will become apparent to those of ordinary skill in the art.

In accordance with common practice, the various features illustrated in the drawings may not be drawn to scale. The illustrations presented herein are not meant to be actual views of any particular apparatus (e.g., device, system, etc.) or method, but are merely idealized representations that are employed to describe various embodiments of the present disclosure. Accordingly, the dimensions of the various features may be arbitrarily expanded or reduced for clarity. In addition, some of the drawings may be simplified for clarity. Thus, the drawings may not depict all of the components of a given apparatus or all operations of a particular method.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal for clarity of presentation and description. It should be understood by a person of ordinary skill in the art that the signal may represent a bus of signals, wherein the bus may have a variety of bit widths and the present disclosure may be implemented on any number of data signals including a single data signal.

The various illustrative logical blocks, modules, circuits, and algorithm acts described in connection with embodiments disclosed herein may be implemented as electronic hardware, computer software, or combinations of both. To clearly illustrate this interchangeability of hardware and software, various illustrative components, blocks, modules, circuits, and acts are described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the embodiments of the disclosure described herein.

In addition, it is noted that the embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be rearranged. A process may correspond to a method, a function, a procedure, a subroutine, a subprogram, etc. Furthermore, the methods disclosed herein may be implemented in hardware, software, or both. If implemented in software, the functions may be stored or transmitted as one or more computer-readable instructions (e.g., software code) on a computer-readable medium. Computer-readable media may include both computer storage media and communication media including any medium that facilitates transfer of a computer program from one place to another. Computer-readable media may include volatile and non-volatile memory, such as, for example, magnetic and optical storage devices, such as, for example, hard drives, disk drives, magnetic tapes, CDs (compact discs), DVDs (digital versatile discs or digital video discs), solid state storage devices (solid state drives), and other similar storage devices.

Elements described herein may include multiple instances of the same element. In some instances, these elements may be generically indicated by a numerical designator (e.g., 112) and specifically indicated by the numerical indicator followed by a dash and a number (e.g., 112-1). For ease of following the description, for the most part, element number indicators begin with the number of the drawing on which the elements are introduced or most fully discussed. Thus, for example, element identifiers on a FIG. 1 will be mostly in the numerical format 1xx and elements on a FIG. 3 will be mostly in the numerical format 3xx.

As used herein, the terms "energy storage cell" and "energy storage cells" refer to any electrochemical cells (e.g., non-rechargeable or rechargeable) that converts chemical energy to electrical energy. The terms "battery," "cell," "battery cell," and "electro-chemical cell" may be used interchangeably herein with the term "energy storage cell."

As used herein, the term "self-discharge current" refers to the rate of internal discharge of charge stored by an energy storage cell, in contrast with charge flowing out of the energy storage cell through its terminals and external circuit to discharge externally from the energy storage cell by discharge current. Some of this self-discharge current may result from internal soft short circuits (ISSCs), internal hard short circuits (IHSCs), reversible and irreversible reduction and oxidation chemical side reactions, and combinations thereof. As a combined effect, self-discharge current ($I_{SD}$, FIG. 1) is considered as an electron flow directed from the negative electrode of the cell towards the positive electrode within the cell. There is the redistribution of positive charges within the cell associated with self-discharge current to keep neutrality in internal circuit. The self-discharge current flowing internally is a background current and cannot be measured directly by a current measuring device. In the case of constant voltage discharge the discharge current is a drift declining current. The discharge current is a result of faradaic reactions. Discharge (negative) current hereafter is considered as an electron flow directed from the negative electrode of an energy storage cell to the positive electrode in external circuit. At the same time redistribution of ions among the electrodes within the energy storage cell does occur (for example, Li cations move from the negative to the positive electrode of Li-ion cell) to keep neutrality in external circuit. The discharge current flowing in external circuit can be measured directly with a current measuring device.

As used herein, the terms "internal soft short circuit," "ISSC," and "soft short circuit" refer to an internal short circuit in an energy storage cell (e.g., nascent short or intermittent short) that does not pose an immediate danger for thermal runaway of the energy storage cell due to excessive self-discharge current. Although formation of these ISSCs may be accompanied by an increase in self-discharge current, the increased self-discharge current may not be great enough to trigger thermal runaway (and accompanying catastrophic failures). These ISSCs may be formed by tiny conductive dendrites (e.g., lithium dendrites) forming between electrodes of an energy storage cell. In lithium-ion energy storage cells, lithium dendrites may form when a charge rate exceeds a rate of lithium intercalation in the negative electrode of the energy storage cell. Such dendrite formation may occur during low temperature charging, overcharging, or as the response to a mismatch in capacity between the negative and positive electrodes of the energy storage cell due to energy storage cell aging. Sometimes copper dendrites may form when a relatively low capacity energy storage cell in a string of energy storage cells over-discharges, and current flow from higher capacity energy storage cells in the string drive the discharged energy storage cell into reversal. A lower capacity energy storage cell may result from aging or increased self-discharge of the cell. In such instances, copper from the anode may dissolve, releasing copper cations into the electrolyte, which may form copper dendrites during subsequent energy storage cell charging. Shorts may also form from conductive contaminants introduced into the energy storage cell (e.g., during manufacturing). Regardless of how ISSCs are formed, they may develop into IHSCs, which may result in thermal runaway and catastrophic failure of the energy storage cell.

As used herein, the terms "internal hard short circuit," "IHSC," and "hard short circuit" refer to an internal short circuit in an energy storage cell that poses an immediate danger for thermal runaway of the energy storage cell. Formation of these IHSCs may be accompanied by substantial increases in self-discharge current, increased rate of heat generation, substantial drops in open circuit voltage (OCV) of the energy storage cell, and release from the cell.

Disclosed herein are systems and methods for determining a self-discharge current of energy storage cells to quickly and accurately detect ISSCs and IHSCs in the energy storage cells before catastrophic failures occur. As self-discharge current may not be measured directly, it may be determined in indirect way. As described more fully below, $I_{TEST}$ current may include two portions: $I_{TEST}$ 124 (negative) and $I_{TEST}$ 124A (positive) discussed more fully below. Under a test, the $I_{TEST}$ current may start from $I_{TEST}$ 124 (negative), which transforms to $I_{TEST}$ 124A (positive) after a current zero crossing point (CZCP). The $I_{TEST}$ current may be a combination of discharge drift current corresponding to faradaic processes and self-discharge current running in background. Open circuit voltage is a step preceding constant voltage step under which the measurement and determination of self-discharge current may be performed. An advantage of this method may include the OCV step being shortened because stabilization of OCV may not be required. Another advantage may include the CZCP point being an indicator of where a correct measurement can be started with confidence.

FIG. 1 is a simplified block diagram of a system 100 for determining a self-discharge current of one or more energy storage cells 110 (hereinafter "energy storage cell" 110). The system 100 may include a DC voltage source 130 operably coupled to the energy storage cell 110, and a current measuring device 120 operably coupled between the DC voltage source 130 and one of terminals 112-1 (a positive terminal) and 112-2 (a negative terminal) (sometimes referred to generically together as "terminals" 112, and separately as "terminal" 112) of the energy storage cell 110. In some embodiments, the energy storage cell 110 may include at least one of a lithium-ion, lithium metal, sodium ion, lead acid, nickel-cadmium and a nickel-metal-hydride battery. In some embodiments, the energy storage cell 110 may include a battery having a chemistry based upon multi-valent cations such as, for example, magnesium or aluminum. It is also contemplated that the energy storage cell 110 may include any other electrochemical cell known in the art.

The energy storage cell 110 may include a plurality of energy storage cells 110, in some embodiments. By way of non-limiting example, the energy storage cell 110 may include at least two energy storage cells 110 operably coupled in parallel. Also by way of non-limiting example, the energy storage cell 110 may include at least two energy storage cells operably coupled in series. As a further non-limiting example, the energy storage cell 110 may include at least two energy storage cells 110 operably coupled in series, and at least two energy storage cells 110 operably coupled in parallel.

Before and after connection of an external circuit to the energy storage cell 110, self-discharge current slowly shifts a state of charge (SOC) of the energy storage cell 110 to lower values. At the OCV condition, the SOC does not stabilize completely as a result of self-discharge. The DC voltage source 130 may be configured to apply a constant test voltage $V_{TEST}$ across the terminals 112 of the energy storage cell 110, while the current measuring device 120 measures the test current $I_{TEST}$ resulting from this potentiostatic (PS) polarization. The constant test voltage $V_{TEST}$ may be selected to be slightly less than an un-stabilized OCV value of the energy storage cell 110. The constant test voltage $V_{TEST}$ represents a new SOC (SOC of interest) of the energy storage cell 110 that is desired to be approached from an initial higher SOC under OCV conditions, and then kept constant. The new SOC at $V_{TEST}$ corresponds to the cell equilibrium conditions when redistribution of Li cations within the cell is complete or close to completion. By way of non-limiting example, the constant test voltage $V_{TEST}$ may be about 0.2 millivolt (mV) to twenty (20) mV less than the OCV of the energy storage cell 110 (e.g., depending on chemistry and environmental conditions of the energy storage cell). When the constant test voltage $V_{TEST}$ is applied to the energy storage cell 110 by the DC voltage source 130, a cell voltage $V_{CELL}$ of the energy storage cell 110 may drop relatively rapidly to the constant test voltage $V_{TEST}$ and then stay equal to $V_{TEST}$ during the procedure. The PS polarization or overvoltage (by other words) applied to the cell electrodes (e.g., the difference between OCV and $V_{TEST}$) initially generates a relatively large discharging (negative) test current 124 (sometimes referred to herein as "$I_{TEST}$" 124) corresponding to discharge of the energy storage cell 110. $I_{TEST}$ 124 fades for a period of time after the constant test voltage $V_{TEST}$ is applied to the energy storage cell 110.

Figure 2:
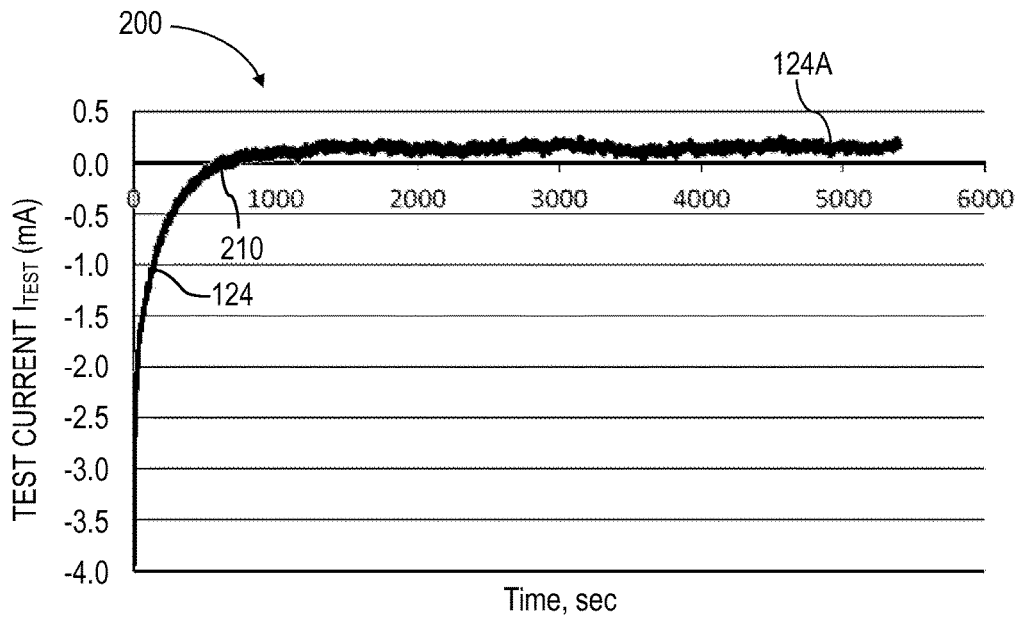
FIG. 2 is a plot of an example test current plotted against time that may be observed after an example energy storage cell of FIG. 1 is operably coupled to a DC voltage source of FIG. 1

FIG. 2 is a plot 200 of the portions of an example test current 124 and 124A of the test current $I_{TEST}$ of FIG. 1, plotted against time. The test current 124 may be initially observed after an example energy storage cell 110 of FIG. 1 is operably coupled to a DC voltage source 130 of FIG. 1. Referring to FIGS. 1 and 2 together, as the energy storage cell 110 initially discharges under constant voltage $V_{TEST}$, a drift current associated with faradaic processes and a self-discharge current (in the background) drive the energy storage cell 110 from initial SOC to a new SOC corresponding to $V_{TEST}$. The $I_{TEST}$ represents a combined effect of drift current and self-discharge current ($I_{SD}$). At a time when the DC voltage source 130 is operably coupled to the energy storage cell 110 (e.g., at time zero (0) of the plot 200 of FIG. 2), the $I_{TEST}$ current as a combination of drift and self-discharge currents may be a relatively large negative (discharge) current because initial overvoltage is relatively high. The drift current and self-discharge current act together to withdraw capacity from the cell reducing SOC and, therefore, overvoltage. This, in turn, reduces $I_{TEST}$ 124 until, over time, the $I_{TEST}$ approaches zero.

A zero-crossing point or CZCP 210 (at about a time six hundred sixty seconds, or eleven minutes, after the DC voltage source 130 is operably coupled to the energy storage cell 110) of the example test current is shown in FIG. 2. Zero current value of $I_{TEST}$ means that DC voltage source 130 is equilibrated with energy storage cell 110 and new SOC under constant test voltage $V_{TEST}$ has been achieved. It may also mean that redistribution of Li cations within the cell is almost complete and the cell is close to equilibrium condition at $V_{TEST}$. At a minimum, the flow of Li cations associated with external current may be negligible. There may be a relatively insignificant Li cations flow associated with self-discharge current $I_{SD}$. At the CZCP 210 and later, however, self-discharge current $I_{SD}$ may act to reduce the SOC below the SOC value corresponding to constant voltage $V_{TEST}$. In response, the DC voltage source 130 may provide a positive (charge) current 124A after the CZCP 210 in order to compensate for the self-discharge current within the energy storage cell 110. This positive current from the DC voltage source 130 may maintain the SOC of the energy storage cell 110 at the SOC value corresponding to the constant test voltage $V_{TEST}$.

After the CZCP 210, $I_{TEST}$ 124A may settle to fluctuate around a value of $I_{TEST}$ 124A that is about equal, but opposite (in polarity), to the self-discharge current value of the energy storage cell 110. Opposite polarity reflects the fact that $I_{TEST}$ 124A is a charging current compensating for self-discharge losses after the CZCP 210. In the example of FIG. 2, $I_{TEST}$ 124A settled to fluctuate around approximately 144 micro-amps (µA). The $I_{TEST}$ 124A at its stabilized value may primarily represent self-discharge at stable new SOC at the conditions when redistribution of Li cations is finalized (charge equilibrium within the cell is reached). The current CZCP 210 may be a solid indicator that methods for determination of self-discharge current may be started. The selection of the constant test voltage $V_{TEST}$ to be less than the not stabilized open-circuit voltage value of the energy storage cell 110 may encourage the energy storage cell 110 to equilibrate with the voltage source relatively quickly (e.g., in less than an hour) and under control to start correct and meaningful determination of self-discharge current.

If, however, the constant test voltage $V_{TEST}$ applied to the energy storage cell 110 were instead selected to be the same as the not-stabilized OCV of the energy storage cell 110 or higher, the drift current would have initial positive (charge) values. This drift current, together with positive current compensating for self-discharge, would never reach a CZCP. Also, equilibration of the energy storage cell 110 at applied $V_{TEST}$ may take a relatively long time (e.g., days or weeks). Longer time for equilibration (or achieving a new SOC at $V_{TEST}$) is a reality based on the fact that self-discharge current and drift charge current are acting in opposite direction. Accordingly, in this scenario it may be unclear at what point in time it would be proper to begin determining self-discharge current. A decision may be arbitrary (e.g., subjective), and unreliable.

Another possibility is to select the $V_{TEST}$ the same as a stabilized OCV. The "stabilized" OCV means that OCV corresponding to certain SOC stays constant. The time required for the OCV to stabilize at certain SOC may take a relatively long time, and may not be readily determined. Redistribution of ions within the cell under OCV conditions is significantly slower than for forced slight discharge conditions. For the cell experiencing self-discharge or short the OCV and SOC never stabilizes for a full extent. Accordingly, the time at which determination of self-discharge current should begin in this scenario may be arbitrary, and subjective.

In summary, the selection of the constant test voltage $V_{TEST}$ to be less than the not stabilized open-circuit voltage of the energy storage cell 110 may greatly accelerate the determination of self-discharge current by reducing the time for preceding OCV step, and by quickly equilibrating the SOC of the energy storage cell 110 to new SOC corresponding to $V_{TEST}$. In this scenario, the time at which equilibration of the energy storage cell 110 to $V_{TEST}$ occurs may be well defined (i.e., at about the CZCP 210) and may be controlled. As a result, the self-discharge current determination may also be well defined and accurate because the self-discharge current may be determined when other currents are known to have dissipated. An accurate determination of the self-discharge current of the energy storage cell 110 may be achieved by measuring $I_{TEST}$ 124A after it has stabilized following the CZCP 210. At this time, $I_{TEST}$ 124A may be a stable current that primarily compensates for the self-discharge current under controlled and stable SOC, where redistribution of ions is complete, and self-discharge current is essentially the only running current.

The smaller the difference between $V_{TEST}$ and the open-circuit voltage potential, the faster the zero-crossing point 210 may occur after applying $V_{TEST}$ to the energy storage cell 110. Also, the larger the self-discharge current, the faster the zero-crossing point 210 may occur after applying $V_{TEST}$ to the energy storage cell 110. Therefore, the difference between $V_{TEST}$ and the OCV potential should be selected with speed constraints in mind.

With continued reference to FIGS. 1 and 2, the self-discharge current of the energy storage cell 110 may be determined by measuring stabilized $I_{TEST}$ 124A after $I_{TEST}$ switches from negative (discharge) to positive (charge). The current measuring device 120 may be configured to measure $I_{TEST}$ 124, 124A, and provide measured current signals 122 (hereinafter "measured current" 122) indicating $I_{TEST}$ 124, 124A to control circuitry 140 of the system 100. By way of non-limiting example, the measured current 122 may include analog signals (e.g., a voltage signal having a voltage proportional to $I_{TEST}$), digital signals (e.g., including digital data indicating sampled values of $I_{TEST}$ 124, 124A), or a combination thereof.

The control circuitry 140 may be operably coupled to the current measuring device and a user interface 150 of the system 100. The control circuitry 140 may be configured to receive the measured current 122 and determine the self-discharge current of the energy storage cell 110 by analyzing the measured current 122. The control circuitry 140 may also be configured to provide output 152 indicating a state of health of the energy storage cell 110 on the user interface 150. The state of health may be based, at least in part, on the determined self-discharge current of the energy storage cell 110.

In some embodiments, the user interface 150 may include a display (e.g., an electronic display) configured to display the determined self-discharge current of the energy storage cell 110. In such embodiments, the output 152 may include an electrical signal indicating the determined self-discharge current.

In some embodiments, the user interface 150 may include an indicator configured to alert a user of the system 100 that the energy storage cell 110 should be examined, maintained, replaced, or combinations thereof. In such embodiments, the output 152 may include a signal configured to activate the indicator. By way of non-limiting example, the user interface 150 may include a visual indicator (e.g., a replace battery light on the dash of a vehicle including the energy storage cell, a warning indicator displayed on a display (e.g., a liquid crystal display (LCD)) of a battery-powered device 160 including the energy storage cell 110, etc.), an audible indicator (an alarm, a beeping, etc.), a haptic indicator (e.g., a vibration), and combinations thereof.

In embodiments where the control circuitry 140 is configured to activate an indicator of the user interface 150 indicating that the energy storage cell 110 should be replaced, the control circuitry 140 may be configured to analyze the determined self-discharge current to activate the indicator before IHSCs occur. The self-discharge current of the energy storage cell 110 may increase gradually over time without posing a threat of catastrophic failure. Formation of ISSCs that may mature into dangerous IHSCs, however, may be accompanied by a substantial increase in self-discharge current. Accordingly, in some embodiments, the control circuitry 140 may be configured to activate the indicator of the user interface 150 responsive to substantial changes in the self-discharge current. By way of non-limiting example, the control circuitry 140 may be configured to activate the indicator responsive to an increase of determined self-discharge current over a previously determined self-discharge current of at least an order of magnitude.

Figure 3:
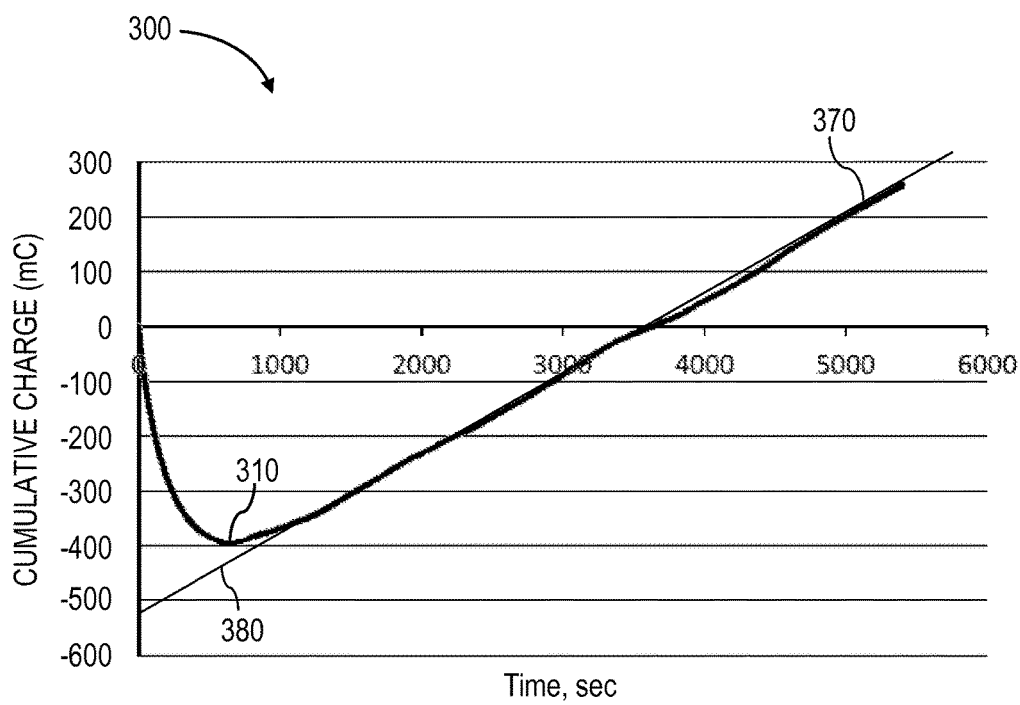
FIG. 3 is a plot of cumulative capacity acquired by the energy storage cell of FIG. 1 responsive to the example test current of FIG. 2, plotted against time.

The control circuitry 140 may use any of a variety of methods to determine the self-discharge current of the energy storage cell 110. In some embodiments, the control circuitry 140 may be configured to determine cumulative charge (capacity) 370 (FIG. 3) accumulated in the energy storage cell 110 due to $I_{TEST}$ 124, 124A, and calculate the self-discharge current of the energy storage cell 110 by calculating the rate of change in cumulative charge accumulated over time. FIG. 3 is a plot 300 of the cumulative charge 370 accumulated by the energy storage cell 110 of FIG. 1 responsive to the test current 124, 124A of FIG. 2, plotted against time. Referring to FIGS. 1 through 3 together, the cumulative charge 370 decreases after the constant test voltage $V_{TEST}$ is applied to the energy storage cell 110 until the CZCP 210 of the test current 124, 124A. At the CZCP 210 of the test current 124, 124A, the cumulative charge 370 switches from decreasing to increasing. Accordingly, a minimum 310 of the cumulative charge 370 may occur at the same time as the CZCP 210. Thus, the point of time when the drift current of the energy storage cell 110 is almost dissipated may be detected by either the CZCP 210 or the minimum 310.

As seen in the plot 200 of FIG. 2, $I_{TEST}$ 124A, may settle to fluctuate around a value of $I_{TEST}$ 124A that is, as previously discussed, about the same (but with opposite polarity) as the self-discharge current value of the energy storage cell 110. These fluctuations may be mostly seen in the plot 200 of FIG. 2 after the CZCP 210. The resulting cumulative charge 370, however, may be relatively smooth because the fluctuations in test current 124A may cancel with each other when accumulated over time.

Figure 4:
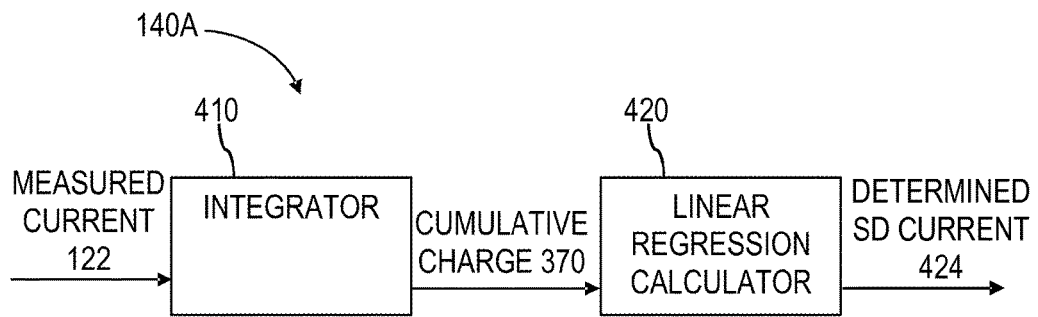
FIG. 4 is a simplified block diagram of example control circuitry of FIG. 1 that is configured to determine a self-discharge current of the energy storage cell of FIG. 1 by estimating the slope of cumulative capacity acquired by the energy storage cell.

In some embodiments, the control circuitry 140 may be configured to determine the self-discharge current of the energy storage cell 110 by estimating a slope of the cumulative charge 370 with respect to time after the minimum 310. By way of non-limiting example, an estimate line 380 may be determined to approximate the cumulative charge 370 after the minimum 310, and the slope of the estimate line 380 may be determined to be the self-discharge current of the energy storage cell 110. FIG. 4 is a simplified block diagram of an example control circuitry 140A of the control circuitry 140 of the system IPO of FIG. 1 that is configured to determine the self-discharge current of the energy storage cell 110 by estimating the slope of the cumulative charge 370. The control circuitry 140A may include an integrator 410 and a linear regression calculator 420. The integrator 410 may be configured to receive the measured current 122 from the current measuring device 120 (FIG. 1), and calculate the cumulative charge 370 by integrating the measured current 122 with respect to time. The linear regression calculator 420 may be configured to perform a linear regression of the cumulative charge 370 after the minimum 310 to determine a slope of the estimate line 380, and provide a determined self-discharge current 424 equal to the determined slope of the estimate line 380.

As the cumulative charge 370 is non-linear around the minimum 310 (FIG. 3), the accuracy of the determined self-discharge current 424 may be improved by basing the slope of the estimate line 380 on a larger number of samples of the cumulative charge 370 taken after the minimum 310. Of course, taking a larger number of samples takes a longer period of time after the minimum 310 than taking a smaller number of samples. Accordingly, a design choice of how many samples to base the slope of the estimate line 380 on may be made by balancing accuracy requirements and time constraints of the system 100 (FIG. 1). Accuracy of the determined self-discharge current 424 may also be improved by waiting a short time (e.g., around 15 minutes) until the cumulative charge 370 is substantially linear to start taking samples of $I_{TEST}$ 124 for determining the slope of the estimate line 380.

Figure 5:
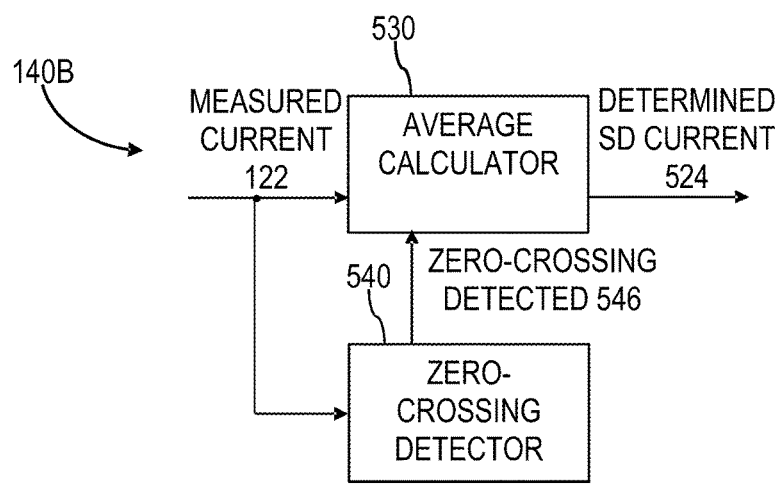
FIG. 5 is a simplified block diagram of example control circuitry of FIG. 1 that is configured to determine the self-discharge current of the energy storage cell of FIG. 1 by averaging a measured test current at its positive stabilized values.

Referring again to FIG. 1, in some embodiments, the control circuitry 140 may be configured to determine the self-discharge current of the energy storage cell 110 by computing an average of the measured current 122 after the zero-crossing point 210. Computing the average of the measured current 122 may cancel the fluctuations in the measured current. FIG. 5 is a simplified block diagram of example control circuitry 140B of the control circuitry 140 of FIG. 1 that is configured to determine the self-discharge current of the energy storage cell 110 by averaging the measured current 122.

The control circuitry 140B may include an average calculator 530 and a zero-crossing detector 540. The zero-crossing detector 540 may be configured to receive the measured current 122, and detect the zero-crossing point (e.g., the zero-crossing point 210 of FIG. 2) of $I_{TEST}$ 124, 124A. The zero-crossing detector 540 may also be configured to provide an indication 546 that the zero-crossing point was detected to the average calculator 530 responsive to detecting the zero-crossing point 210. The average calculator 530 may be configured to receive the measured current 122, and calculate an average of the measured current 122 after receiving the indication 546 of the zero-crossing detected from the zero-crossing detector 540. The average calculator 530 may also be configured to provide a determined self-discharge current 524 equal to the average of the measured current 122. Similar to the control circuitry 140A of FIG. 4, the control circuitry 140B may improve accuracy of the determined self-discharge current 524 by taking a greater number of samples of $I_{TEST}$ 124A (i.e., sampling for a longer time after the zero-crossing point), or waiting until $I_{TEST}$ 124A becomes stable before taking measured samples of $I_{TEST}$ 124A into account in determining the determined self-discharge current 524.

Referring again to FIG. 1, in some embodiments, the control circuitry 140 may be configured to determine the self-discharge current of the energy storage cell 110 by using mathematical models and measured data (e.g., the measured current 122 from the current measuring device 120) to estimate the self-discharge current. By way of non-limiting example, plots of potentiostatic (PS) test currents $I_{TEST}$ of energy storage cells 110 may exhibit a characteristic s-curve (sigmoidal) when plotted against a logarithm of time. Thus, the control circuitry 140 may be configured to create a sigmoidal model (comprised of one or more mathematical components) of $I_{TEST}$ using the measured current 122 from the current measuring device 120. The model approach herein is comprised of two components (processes) that influence current under the test conditions: one to capture the influence of forced discharge at PS conditions due to PS polarization, and another to capture self-discharge and to account both for the transition into cell equilibrium under the condition of $V_{TEST}$. For purposes herein we refer to the net current under these collective conditions as the test current. As a specific, non-limiting example, the control circuitry 140 may be configured to create a sigmoidal model of $I_{TEST}$ according to a mathematical equation:

$$I_{TEST}(t) = I_{POL}\left(1 - de^{-\frac{t}{c}}\right) - 2(I_{POL}(1-d))\left(\frac{1}{2} - \frac{1}{1 + e^{\left(\frac{t}{a}\right)^b}}\right) + I_{SD,TRUE}, \quad (1)$$

where:
t is time;
$I_{POL}$ is the net magnitude of negative discharge current observed at time zero (when the energy storage cell 110 is operably coupled to the DC voltage source) resulting from polarization or non-equilibrium conditions at system conditions of temperature and battery state of charge;
$I_{SD,TRUE}$ (same as $I_{TEST}$ 124A on FIG. 1 and FIG. 2, but with opposite polarity) is a net magnitude of the true, at equilibrium self-discharge current, of the energy storage cell 110;
a is an inverse rate constant for PS equilibrium process of cell at $V_{TEST}$;
b is an "order of process" constant for PS condition for cell approaching equilibrium at $V_{TEST}$;
c is a time factor for PS polarization/relaxation process; and
d is a measure reflecting a magnitude of initial current in response to ohmic impedance of the energy storage cell 110 and the constant test voltage $V_{TEST}$ relative to the time-zero OCV of the energy storage cell 110.

Figure 6:
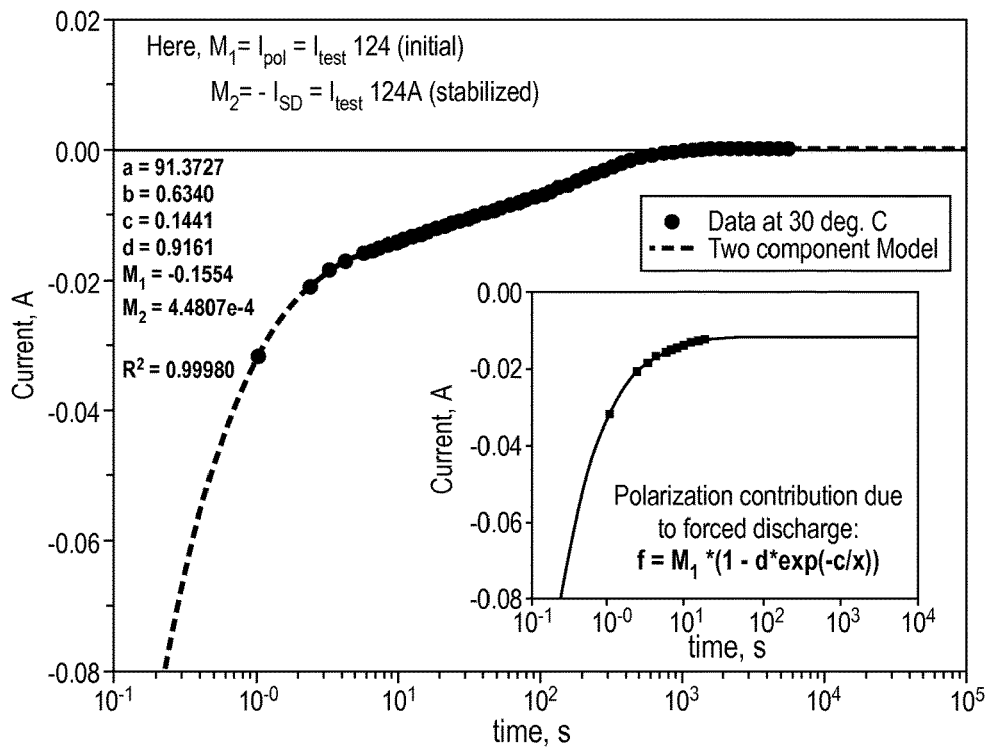
FIG. 6 is application of two-process model Eq. (1) to describe self-discharge behavior of a commercial Li-ion cell.

Equation (1) is formulated to determine the true self-discharge current and related model parameters for current data that ranges from early time (discharge state) to time well past that required to reach the current zero-crossing point (the region after CZCP where charge current compensates self-discharge current). Such a mathematical expression is very helpful in isolating the true self-discharge current when the source data is noisy. A non-limiting example of application of Eq. (1) is given in FIG. 6, wherein data from a commercial Li-ion cell is analyzed. The control circuitry 140 may be configured to perform model-fitting analysis (e.g., a regression) to determine values for model parameters $I_{POL}$, $I_{SD}$, $I_{TRUE}$, a, b, c, and d that cause Eq. (1) to fit sampled values of the measured current 122. The value for $I_{SD,TRUE}$ may then be determined by the control circuitry 140.

As another specific, non-limiting example, the control circuitry 140 may be configured to implement another sigmoidal-type model of $I_{TEST}$ 124 according to another expression:

$$I_{TEST}(t) = (I_{POL} - I_{SD,TRUE})\left(1 - de^{-\frac{t}{c}}\right) - \quad (2)$$

$$2((I_{POL} + I_{SD,TRUE})(1-d))\left(\frac{1}{2} - \frac{1}{1 + e^{\left(\frac{t}{a}\right)^b}}\right) - I_{SD,TRUE}.$$

For this approach, fitting the sigmoidal model to the measured current 122 corresponding to samples from a time range measured from the time that the DC voltage source 130 is operably coupled to the energy storage cell 110 until the zero-crossing point (e.g., from t=0 to the zero-crossing point 210) may be sufficient to provide an accurate estimate of the self-discharge current. Accordingly, another sigmoidal model approach may be a relatively fast approach for determining the self-discharge current (e.g., on the order of ten to twenty minutes, or less in some instances). A non-limiting example of application of Eq. (2) is given in FIG. 7, wherein data from a commercial Li-ion cell near 4.2V is analyzed over four test runs. Each data set represented in FIG. 7 starts at time zero and progresses to the current zero-crossing point, such that all data are negative current (discharge). Tabular values of self-discharge currents related to the FIG. 7 data and model predictions are given in Table 1, where overall average deviation between data and model values is around 6%. This result is remarkable considering the very small magnitude of the self-discharge current and the appreciable relative data scatter that can occur at those test conditions.

TABLE 1

Comparison of experimental and model (Eq. 3) values for self-discharge current at $V_{TEST}$ near 4.2 V

| Experimental Run | SD current, Experiment (Amps) | SD current, model (Amps) |
| --- | --- | --- |
| 2 | −4.297e−04 | −4.558e−04 |
| X | −1.54e−04 | −1.636e−04 |
| XX | −0.89e−04 | −0.786e−04 |
| 3X | −0.75e−04 | −0.747e−04 |

The model parameters $I_{POL}$, $I_{SD}$, $I_{TRUE}$, a, b, c, and d may vary as functions of temperature of the energy storage cell 110, state of charge of the energy storage cell 110, age of the energy storage cell 110, other factors, or combinations thereof. Also, redox side reactions may constitute parts of both $I_{POL}$, $I_{SD,TRUE}$. Accordingly, $I_{POL}$ and $I_{SD,TRUE}$ may provide insights into boundaries for parasitic currents involved in various side reactions. Quantification of the magnitude of the redox side reactions may be performed by comparing irreversible capacity loss due to self-discharge current with net capacity loss (both reversible and irreversible capacity loss) using the sigmoidal equation (1) or (2), or a combination thereof. For example, integrating $I_{TEST}$ from the sigmoidal equation (1) provides net capacity loss $Q_{LOSS,NET}$, given by:

$$Q_{LOSS,NET} = \int_0^{t_{SD}} I_{TEST}(t)dt = \int_0^{t_{SD}} I_{POL}\left(1 - de^{-\frac{t}{\tau}}\right)dt - \int_0^{t_{SD}} 2(I_{POL}(1-d))\left(\frac{1}{2} - \frac{1}{1+e^{\left(\frac{t}{a}\right)^b}}\right)dt + I_{SD,TRUE}t_{SD}, \quad (3)$$

where $t_{SD}$ is the net duration of an arbitrary self-discharge test period following time t=0. A similar expression may be derived by integrating $I_{TEST}$ of the other sigmoidal equation (2). By allowing $t_{SD}$ to be very large in Eq. (3) past the typical analysis times, capacity losses during prolonged self-discharge periods can be estimated, which can support intelligent selection of battery use conditions for a number of application scenarios.

Once the net capacity loss $Q_{LOSS,NET}$ is obtained by Eq. (3), an updated value for state of charge may be determined by subtracting the net capacity loss $Q_{LOSS,NET}$ from an initial capacity (at time t=0), and cross-matching the result to a capacity state of charge chart for the energy storage cell chemistry of interest. This information may enable estimation of how much viable, usable capacity and power remains after an arbitrary self-discharge period, and how much irreversible capacity is lost over the life of the energy storage cell, given estimates of frequency of charging and charge voltage targets. In some embodiments, the control circuitry 140 may be configured to numerically integrate $I_{TEST}$ 124 indicated by the measured current 122 from the current measuring device 120 to determine the net capacity loss $Q_{LOSS,NET}$. The control circuitry 140 may then subtract the determined net capacity loss $Q_{LOSS,NET}$ from the initial capacity, and cross-match the result to capacity state of charge information stored (e.g., in the storage devices 860 of FIG. 8) by the control circuitry 140. The control circuitry 140 may use this information to provide estimates of how much viable, usable capacity and power remains, and how much irreversible capacity is lost.

With continued reference to FIG. 1, in some embodiments, the control circuitry 140 may be configured to control the DC voltage source 130 to vary the charge voltage $V_{CHARGE}$ at the end of charging procedure and after short OCV step to apply constant test voltage $V_{TEST}$ for determining the self-discharge current of the energy storage cell 110 at different states of charge of the energy storage cell 110. For example, the control circuitry 140 may be configured to vary the charge voltage $V_{CHARGE}$ of the energy storage cell 110 at any state of charge from zero percent (0%) charged to one hundred percent (100%) charged. The self-discharge current of the energy storage cell 110 may vary depending, at least in part, upon the state of charge of the energy storage cell 110. Accordingly, it may be helpful, in some instances, to determine the self-discharge current of the energy storage cell at more than one state of charge of the energy storage cell 110. Determining the self-discharge current of the energy storage cell 110 at a 100% charged state of charge may be particularly useful in detecting ISSCs.

In some embodiments, the control circuitry 140 may be configured to control environmental conditions (e.g., temperature) of the energy storage cell 110 during testing to determine the self-discharge current of the energy storage cell 110. For example, the self-discharge current may be temperature variant. Also, if no significant ISSCs are detected in the energy storage cell 110 while testing at room temperature, ISSCs may become more pronounced in the energy storage cell 110 during operation if the energy storage cell heats to a higher temperature or cools to a lower temperature in operation. Accordingly, the control circuitry 140 may be operably coupled to a heating element (not shown) or a cooling element (not shown) in proximity to the energy storage cell 110, and adjust the temperature of the energy storage cell 110 to a temperature similar to an operational temperature of the energy storage cell during testing. In this way, more pronounced ISSCs that would not have been detected absent environmental control may be detected, and catastrophic failures may be avoided thereby.

In some embodiments, the control circuitry 140 may be configured to determine the self-discharge current of the energy storage cell 110 at two different temperatures that are at least 5 degrees Celsius apart. In such embodiments, Arrhenius behavior parameters (e.g., activation energy) of the self-discharge current of the energy storage cell 110 may be determined.

Once the self-discharge current of the energy storage cell 110 has been determined (e.g., by computing a rate of change of accumulated charge, by computing an average of $I_{TEST}$ 124A after the zero-crossing point, by using sigmoidal models, etc.) at a set of reference conditions (e.g., temperature, and state of charge of the energy storage cell 110), the self-discharge current at conditions different from the reference conditions may be estimated. In other words, a determination of the self-discharge current of the energy storage cell 110 at a first set of conditions may enable prediction of the self-discharge current at other arbitrarily-chosen conditions that could be outside known test conditions. For example, a predicted self-discharge current $I_{SD}$($\dot{V}_{OCV}$,T) at open-circuit voltage $\dot{V}_{OCV}$ and temperature T may be determined as a function of a determined self-discharge current $I_{SD}$($V_{REF}$,$T_{REF}$) at reference open-circuit voltage $V_{REF}$ and temperature $T_{REF}$ by a prediction equation:

$$I_{SD}(\dot{V}_{OCV}, T) = I_{SD}(V_{REF}, T_{REF})X_T\left(\frac{\dot{V}_{OCV}}{V_{MAX}}\right)e^{-\frac{f}{X_T}\left(\left[\frac{V_{MAX}-V_{MIN}}{\frac{1}{2}(V_{MAX}+V_{MIN})}\right]\left[\frac{V_{MAX}-\dot{V}_{OCV}}{\dot{V}_{OCV}-V_{MIN}}\right]\right)^g}, \quad (4)$$

where
$\dot{V}_{OCV}$ is the representative OCV at conditions of interest, which could in effect be an average over a voltage range where there is non-trivial drift of OCV during self-discharge. To maintain predictive accuracy over an average OCV, $\dot{V}_{OCV}$ should cover relatively small OCV ranges (e.g., 4.2 to 4.195, 4.15 to 4.1V, 3.9 to 3.8V, etc., as non-limiting examples).
$X_T$ is a function of the Arrhenius behavior of the self-discharge current and so reflects the difference between $T_{REF}$ and $T_{PRED}$ ($X_T$=1 if $T_{PRED}$=$T_{REF}$, $X_T$>1 if $T_{PRED}$>$T_{REF}$, and $X_T$<1 if $T_{PRED}$<$T_{REF}$);

f and g are lumped material parameters (e.g., reflecting self-discharge attributes tied to the choice of cell chemistry, electrode particle shapes and sizes, SEI characteristics, ohmic and interfacial impedance contributions, cell aging effects, and other characteristics of the energy storage cell 110);

$V_{MAX}$ is a maximum voltage limit for the energy storage cell 110 (voltage of the energy storage cell at a fully charged state of charge). $V_{REF}$ is often set at $V_{MAX}$; and $V_{MIN}$ is a minimum voltage limit for the energy storage cell 110 (voltage of the energy storage cell fully discharged, or 0% charged state of charge).

This prediction equation ascribes larger self-discharge behavior to energy storage cells 110 at higher temperature and higher open-circuit voltages, while predicting lower self-discharge behavior at lower temperatures and lower open-circuit voltages.

Figure 9:
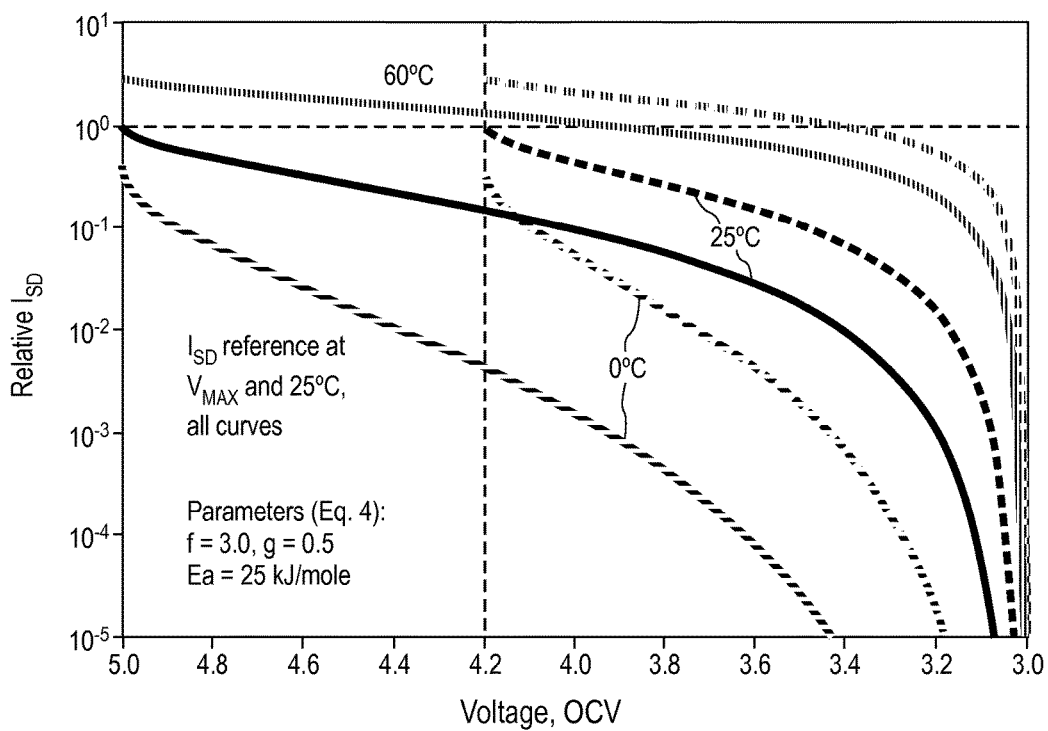
FIG. 9 is application of Eq. (4) to predicting relative self-discharge current over various conditions of temperature and cell open circuit voltage (OCV), considering cell $V_{MAX}$ at 4.2V (dashed curves) and $V_{MAX}$ at 5.0V (solid curves), and temperatures of 0° C., 25° C. and 60° C.

Illustration of the predictive capability of Eq. (4) is shown in FIG. 9 for ranges of temperature and OCV conditions, wherein $I_{SD}$) ($V_{ref}$,$T_{ref}$) or $I_{SD,ref}$ was assigned a value of unity (=1.0) for the sake of demonstration. FIG. 9 shows model results for relative self-discharge current ($I_{SD}/I_{SD,ref}$) considering cases of cell $V_{MAX}$ at 4.2V and 5.0V, and cell temperatures of 0° C., 25° C. and 60° C.; in all cases $V_{MIN}$ was kept at 3.0V. Note that the relative self-discharge current is rendered on a log-based scale. In these Figures, the (f, g) parameters were arbitrarily assigned values of (3.0, 0.5), and an activation energy for $I_{SD}$ was set at 25 kJ/mole. These parameter values can be fine-tuned via data regression to represent particular cell chemistries and states of cell aging. There are some distinctions that can be made, based on the results in FIG. 9. Temperature affects both the magnitude of $I_{SD}$ and the change thereof over OCV, thus the $X_T$ term appears twice in Eq. (4). While $I_{SD}$ is expectedly higher at higher temperature, the rate of change over OCV is less at higher temperature since such conditions push greater self-discharging to lower OCV, compared to the reference conditions. This is intuitively correct from a thermodynamics perspective. Note that the reference value for the $I_{SD}$ has been set at 1.0 for both cases of 4.2 and 5.0V cell chemistries. This was done for illustration only to have a consistent basis for the relative $I_{SD}$ that is plotted in FIG. 9, but in actual cases the reference value at the 5V case would be higher than at 4.2V and the $I_{SD}$ curves in FIG. 9 would shift accordingly.

In some embodiments, the control circuitry 140 may be configured to use a determined self-discharge current and the prediction equation to determine the self-discharge current of the energy storage cell 110 over many different conditions. For example, the control circuitry 140 may vary parameters $X_T$, f, and g to estimate various self-discharge currents of the energy storage cell 110 at various temperatures, states of charge, cell ages, cell chemistries, other conditions, and combinations thereof. The control circuitry 140 may also be configured to provide data indicating the various self-discharge currents of the energy storage cell 110 at the various conditions to the user interface 150 via the output 152.

Once self-discharge current(s) of the energy storage cell 110 have been determined, an equivalent or effective impedance to self-discharging $R_{SD,EFF}$ may be computed for the self-discharge current(s) using a form of the Ohm's Law relation:

$$I_{SD}(\dot{V}_{OCV}, T) = \frac{\dot{V}_{OCV}}{R_{SD,EFF}}. \quad (5)$$

wherein the impedance term would vary with choice of cell materials and (T, V) conditions, and would be a useful screening and diagnostic term. Given that the magnitude of self-discharge current can be micro-amps or less, $R_{SD,EFF}$ can have large values. Larger values of this term are desirable from a self-discharge viewpoint. Equation (5) can be adapted to particular test conditions that may mimic important usage scenarios. For example, as a special case $V_{OCV}$ can be $V_{TEST}$ to yield a form applicable to test conditions:

$$I_{SD}(V_{TEST}, T_{TEST}) = \frac{V_{TEST}}{R_{SD,TEST}}. \quad (6)$$

The foregoing development of modeling analyses (Eqs. (1-6) as non-limiting examples) can be applied to multiple interconnected cells or "strings." As a non-limiting example, a series string (having cells connected end-to-end) will have a test voltage that is effectively the sum of all the constituent cell voltages, and the self-discharge current is a consequence of the collective cell impedances and OCVs, which may vary cell-to-cell. Another non-limiting example is a parallel string wherein cells are connected side-to-side. Self-discharge current is additive over the cells for a parallel configuration, and the string OCV would be approximated by an average over the cell OCVs. Lastly, adaptation of the modeling techniques herein could be performed for combinations of series and parallel strings, as found in many real-world battery designs.

With continued reference to FIG. 1, the control circuitry 140 may include hardware components, software components, or a combination thereof. By way of non-limiting example, the control circuitry 140A (FIG. 4) may include an integrator 410 implemented using an integrating amplifier circuit. Also by way of non-limiting example, the integrator 410 may be implemented with an integration software module. Those of ordinary skill in the art will appreciate that any function that may be performed using hardware components may equivalently be performed by a computing device executing software components (i.e., computer-readable instructions). Accordingly, the control circuitry 140 may include hardware circuitry configured to perform functions of the control circuitry 140. The hardware circuitry may include application specific integrated circuits (ASICs), circuits including discrete circuit components, arrays of logic circuits operably coupled together by hard-wired interfaces (e.g., logic ASICS), arrays of logic circuits operably coupled together by programmed interfaces (e.g., field programmable gate arrays (FPGAs), programmable logic controllers (PLCs), and combinations thereof). The control circuitry 140 may, in addition to or instead of the hardware components, include one or more computing devices configured to execute stored computer-readable instructions configured to instruct the computing devices to perform the functions of the control circuitry 140.

Figure 8:
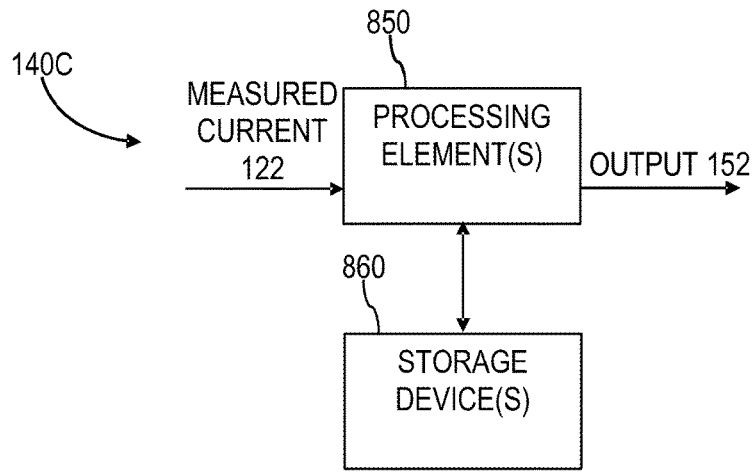
FIG. 8 is a simplified block diagram of example control circuitry of FIG. 1.

By way of non-limiting example, the control circuitry 140 may include example control circuitry 140C of FIG. 8. FIG. 8 is a simplified block diagram of the example control circuitry 140C of the control circuitry 140 of FIG. 1. The control circuitry 140C may include one or more processing elements 850 (hereinafter "processing elements" 850) operably coupled to one or more data storage devices 860 (hereinafter "storage devices" 860). The storage devices 860 may be configured to store computer-readable instructions configured to instruct the processing elements 850 to perform the functions of the control circuitry 140 (FIG. 1). By way of non-limiting example, the computer-readable instructions may be configured to instruct the processing elements 850 to perform the functions of at least one of the integrator 410 (FIG. 4), the linear regression calculator 420 (FIG. 4), the average calculator 530 (FIG. 5), the zero-crossing detector 540 (FIG. 5), the functions discussed below with reference to FIG. 10, other functions (e.g., environmental control proximate to the energy storage cell 110, control over the DC voltage source 130 of FIG. 1, etc.), and combinations thereof. Also by way of non-limiting example, the computer-readable instructions may be configured to instruct the processing elements 850 to determine the self-discharge current of the energy storage cell using mathematical models (e.g., the sigmoidal models, the potentiostatic sigmoidal model, the open-circuit model discussed above). As a further, non-limiting example, the computer-readable instructions may be configured to instruct the processing elements 850 to determine self-discharge currents of the energy storage cell 110 for conditions that are different from reference conditions corresponding to a determined self-discharge current.

The storage devices 860 may include a computer-readable medium configured to store electronic data. By way of non-limiting example, the storage devices 860 may include magnetic and optical storage devices such as disk drives, magnetic tapes, CDs (compact discs), DVDs (digital versatile discs or digital video discs), and semiconductor devices (e.g., RAM, DRAM, ROM, EPROM, flash memory, etc.), and other equivalent storage devices. Also by way of non-limiting example, computer-readable instructions for performing the functions of the control circuitry 140 may be stored on permanent storage of the storage devices 860, and transferred to temporary memory (e.g., RAM) of the storage devices 860 for execution by the processing elements 850. The processing elements 850, when executing the computer-readable instructions configured to instruct the processing elements 850 to perform the functions of the control circuitry, constitute structure for performing the functions of the control circuitry 140 and may be considered a special-purpose computer that enhances the function of the control circuitry 140C when so configured. In addition, as previously discussed, some or all portions of the processes may be performed by hardware specifically configured for carrying out the functions of the control circuitry 140.

The processing elements 850 may include at least one device configured to execute the computer-readable instructions stored by the storage devices 860. The processing elements 850 may include a general-purpose processor, a special-purpose processor, a Digital Signal Processor (DSP), a microcontroller, a central processing unit, other processing elements, and combinations thereof. The processing elements 850 may also be implemented as a combination of computing devices, such as a combination of a DSP and a microprocessor, a plurality of microprocessors, one or more microprocessors in conjunction with a DSP core, or any other such configurations.

Returning to FIG. 1, in operation, the energy storage cell 110 may be charged to a desired state of charge, or open-circuit voltage of interest (e.g., 100% charged). The energy storage cell 110 may be left in a no-load open circuit state for a period of time to allow uneven charge concentration in the energy storage cell 110 (e.g., resulting from charging of the energy storage cell 110) to the energy storage cell 110 to become more uniform. The DC voltage source 130 may then apply the constant test voltage $V_{TEST}$ that is slightly less than the open-circuit voltage of the energy storage cell 110. The current measuring device 120 may measure the test current $I_{TEST}$ flowing between the DC voltage source 130 and the energy storage cell, and provide measured current 122 indicating the test current $I_{TEST}$ to the control circuitry 140. The control circuitry may determine the self-discharge current of the energy storage cell 110 by analyzing the measured current 122, and provide output 152 to the user interface 150. A user of the system 100 may then take action (e.g., replacing, servicing, etc., the energy storage cell 110) based on information provided by the user interface 150.

In some embodiments, the system 100 may include one or more battery-powered devices 160 (sometimes referred to herein as "battery powered device" 160) including at least some of the energy storage cell 110, DC voltage source 130, the current measuring device 120, the control circuitry 140, and the user interface 150. By way of non-limiting examples, the battery-powered device 160 may include a vehicle (e.g., an electric drive vehicle for land, marine, or air use), grid storage, micro-grid storage, consumer electronics (e.g., a laptop computer, a tablet, a smartphone, etc.), and other battery-powered devices 160. As a specific, non-limiting example, the battery-powered device 160 may include a vehicle including the one or more energy storage cells 110, the DC voltage source 130, the current measuring device 120, the control circuitry 140 (e.g., implemented by a computer of the vehicle), and the user interface 150 (e.g., a replace battery light on a dash of the vehicle, a digital display configured to display a warning to replace the energy storage cell, a digital display configured to indicate the self-discharge current, etc.).

As the system 100 may be capable of relatively quickly identifying ISSCs by analyzing a determined self-discharge current of the energy storage cell 110, users of the system 100 may be alerted to possible dangers of catastrophic failures before IHSCs form, constantly and in real time, in contrast with conventional system, which may be destructive, take too much time, and/or fail to identify ISSCs. Also, the use of a slightly lower test voltage $V_{TEST}$, applied to the energy storage cell 110, than cell OCV eliminates the need to establish close to completion equilibration of charge under OCV in the energy storage cell 110 before making arrangements for self-discharge determination or short circuit detection. Furthermore, the use of a slightly lower test voltage $V_{TEST}$ applied to the energy storage cell 110 may enable the control circuitry 140 to definitively identify when (e.g., the zero-crossing point 210 of FIG. 2) the equilibrium of energy storage cell 110 with DC voltage source 130 is reached, and determination of self-discharge current may be started.

In addition, the system 100 may be capable of determining the self-discharge current with relatively minimal equipment, or with equipment already existing in battery management systems, in contrast to some conventional methods. Furthermore, ISSCs may be detected using a single test cycle of the system 100, enabling energy storage cell 110 manufacturers to quickly test product before distribution. Moreover, self-discharge currents for a variety of different conditions (e.g., temperature, state of charge, age, etc.) may be determined after a single test cycle of the system 100. A greater manufacturing throughput rate may be achieved thereby, along with greater certainty that catastrophic failures will not occur.

Figure 7:
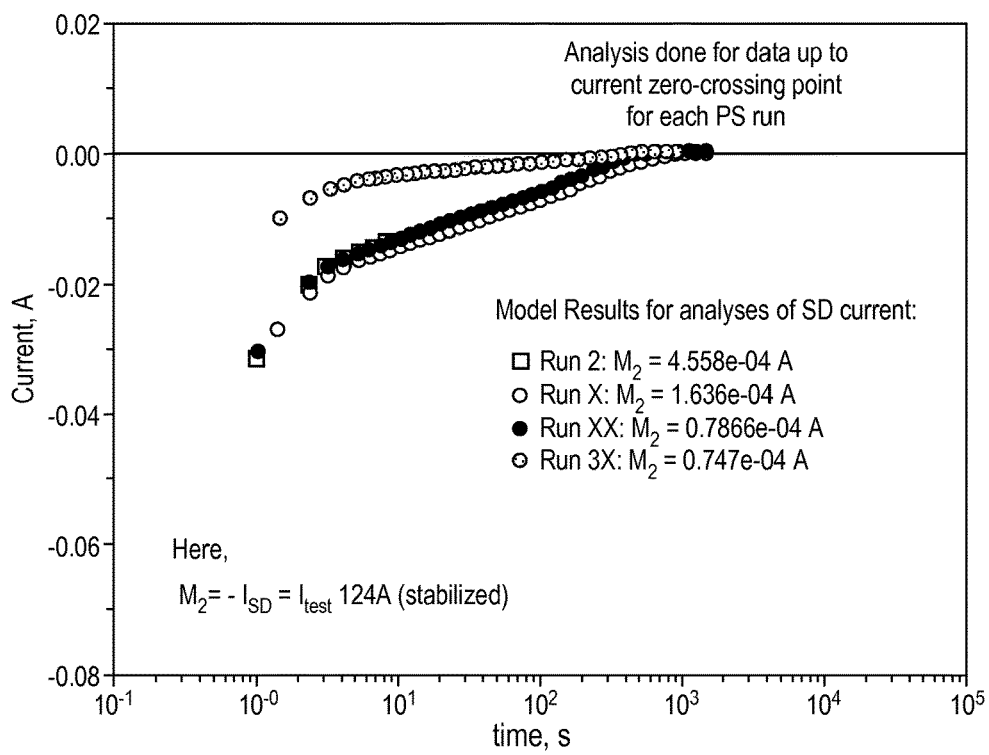
FIG. 7 is results for application of Eq. (2) to short-term test data (discharge condition) that just reached the current zero-crossing point.
Figure 10:
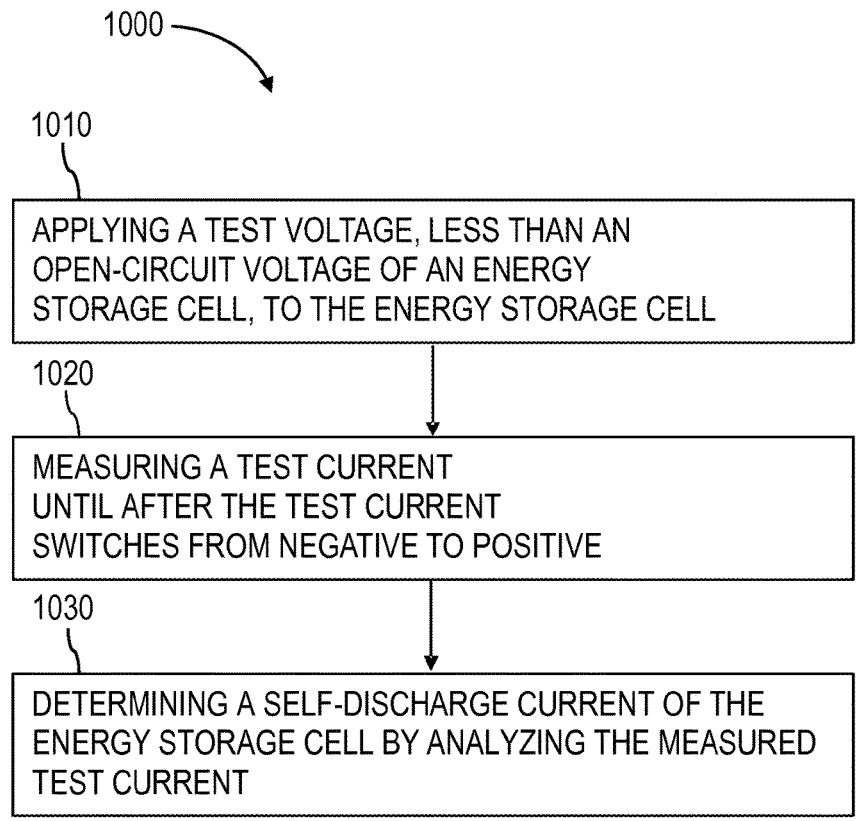
FIG. 10 is a simplified flowchart illustrating a method of determining a self-discharge current of the energy storage cell of FIG. 1.

FIG. 10 is a simplified flowchart 1000 illustrating a method of determining a self-discharge current of the energy storage cell 100 of FIG. 1. Referring to FIGS. 1 and 7 together, at operation 1010, the method may include applying, with a DC voltage source 130, a constant test voltage $V_{TEST}$ to the energy storage cell 110. The constant test voltage $V_{TEST}$ may be less than the open-circuit voltage of the energy storage cell 110.

At operation 1020, the method may include measuring, with a current measuring device, a test current $I_{TEST}$ flowing between the DC voltage source 130 and the energy storage cell 110 until after the test current $I_{TEST}$ switches from a negative (discharge) current $I_{TEST}$ 124 to a positive (charge) current $I_{TEST}$ 124A.

At operation 1030, the method may include determining, with control circuitry 140, a self-discharge current of the energy storage cell 110 by analyzing the measured test current $I_{TEST}$ 124, 124A. In some embodiments, analyzing the measured test current $I_{TEST}$ 124, 124A may include determining a cumulative charge 370 (FIG. 3) delivered to the energy storage cell 110 by the test current $I_{TEST}$ 124, 124A, as a function of time, and estimating a slope of the cumulative charge 370 after a minimum 310 of the cumulative charge 370. In some embodiments, analyzing the measured test current $I_{TEST}$ may include computing an average of the test current $I_{TEST}$ 124A measured after the zero-crossing of the test current $I_{TEST}$. In some embodiments, analyzing the measured test current $I_{TEST}$ may include calculating self-discharge current using a sigmoidal model of $I_{TEST}$ according to a mathematical equation (1). In some embodiments, analyzing the measured test current $I_{TEST}$ in the portion of $I_{TEST}$ 124 may include calculating self-discharge current using sigmoidal-type model of $I_{TEST}$ 124 according to a mathematical equation (2).

Figure 11:
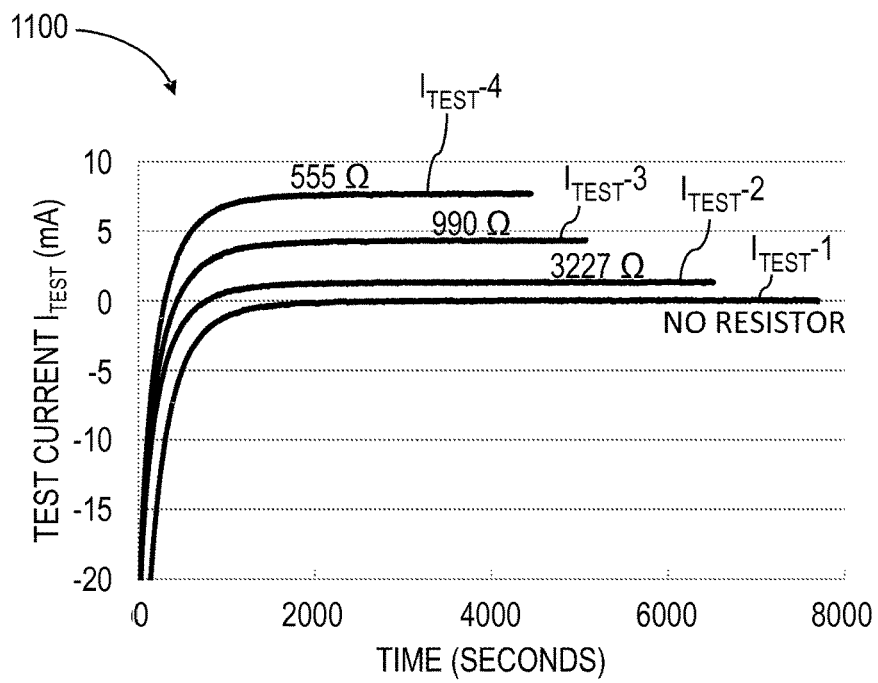
FIG. 11 is a plot of test currents for the cell with different levels of artificial shorts operably coupled across the cell terminals.

FIG. 11 illustrates a plot 1100 of measured test currents $I_{TEST}$-1, $I_{TEST}$-2, $I_{TEST}$-3, and $I_{TEST}$-4 following application of a constant test voltage $V_{TEST}$ to an energy storage cell 110 (FIG. 1) with different levels of artificial shorts operably coupled across the terminals thereof. Specifically, internal shorts were mimicked with resistors (i.e., a 3227Ω resistor, a 990Ω resistor, and a 555Ω resistor) placed across the terminals of the energy storage cell 110. The same energy storage cell 110 was used with each of the different resistors and no resistor. For each case, the energy storage cell 110 was charged to 4.2 volts at constant current, then kept at 4.2 volts until a charge current dropped to 25 mA. Then OCV step was applied until the cell 110 voltage reached cut-off point. The same OCV cut-off condition (4.1920 V) was used for the runs with resistors in order to compare the different short circuit conditions at approximately the same SOC. After 5 min from starting OCV step, resistor was connected to the cell. For the run with no resistor, OCV cut-off was 1 hour which resulted in 4.1943 V voltage cut-off. After reaching OCV cut-off, $V_{TEST}$=4.190V was applied to the cell, which is 2 mV lower than OCV end point for the runs with resistors and 4.3 mV lower than for the run with no resistor. The plot 1100 illustrates the resulting measured test currents $I_{TEST}$-1, $I_{TEST}$-2, $I_{TEST}$-3, and $I_{TEST}$-4 of the test for each of the no resistor, the 3227Ω resistor, the 990Ω resistor, and the 555Ω resistor cases.

As may be observed in the plot 1100, each of the current values that the test currents $I_{TEST}$-1, $I_{TEST}$-2, $I_{TEST}$-3, and $I_{TEST}$-4 settled to is different. In particular, it appears that the greater the resistance between the terminals of the energy storage cell 110, the lower the measured test current $I_{TEST}$-1, $I_{TEST}$-2, $I_{TEST}$-3, and $I_{TEST}$-4. This result confirms that applying a constant test voltage $V_{TEST}$ to an energy storage cell 110 that is less than the open-circuit voltage of the energy storage cell, and observing the current level that is settled to, may enable differentiation between different levels of internal short circuit of the energy storage cell 110.

As may also be observed in the plot 1100, the time required to reach the zero-crossing point differed for each of the measured test currents $I_{TEST}$-1, $I_{TEST}$-2, $I_{TEST}$-3, and $I_{TEST}$-4. Specifically, it appears that the greater the resistance between the terminals of the energy storage cell 110 (i.e., the smaller the corresponding mimicked internal short circuit), the longer it took for the corresponding test current to reach a point of zero-crossing. Accordingly, the amount of time it takes for the test current $I_{TEST}$ to reach the CZCP may be used as a metric for monitoring self-discharge current, detecting internal short circuits, and monitoring the severity of the internal short circuits.

Another metric that may be used to monitor self-discharge current, detect internal short circuits, and monitor the severity of the internal short circuits is a determined resistance of the internal short circuit. By way of non-limiting example, a resistance of the internal short circuit may be determined by dividing the constant test voltage $V_{TEST}$ by the value of test current $I_{TEST}$ that is stabilized to following the CZCP (e.g., according to equation (6)).

Figure 12:
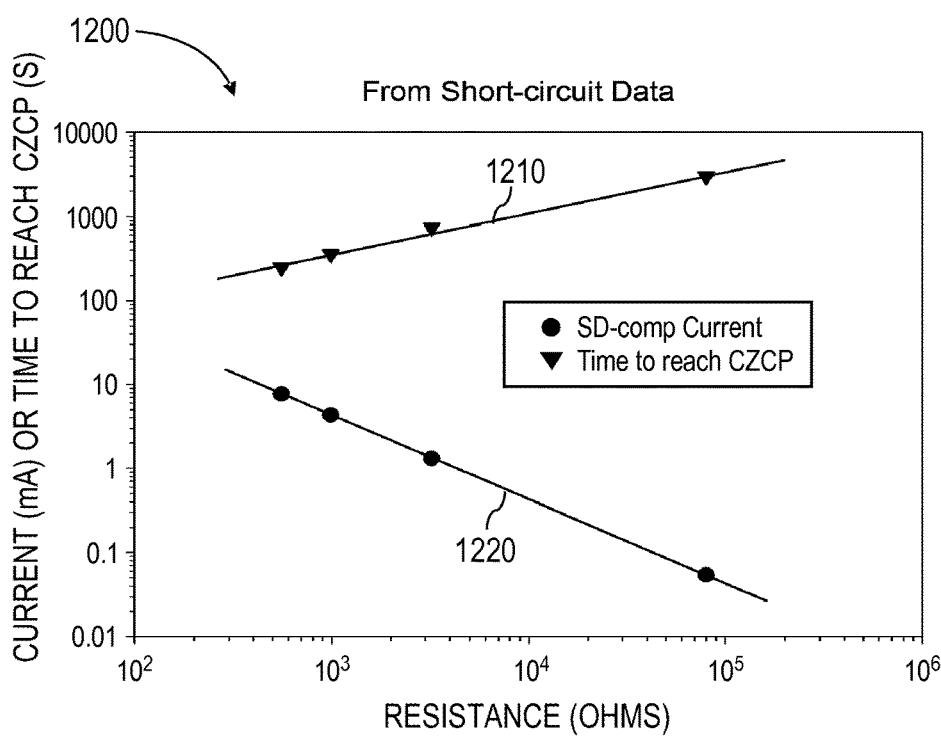
FIG. 12 is a plot of the time to reach current zero crossing point and determined self-discharge currents against resistance of implemented artificial shorts.

FIG. 12 illustrates a plot 1200 illustrating the time required to reach the CZCP 1210, and a magnitude of the determined self-discharge current 1220 (i.e., the values that the test currents $I_{TEST}$-1, $I_{TEST}$-2, $I_{TEST}$-3, and $I_{TEST}$-4 settled to), plotted against the resistance values mimicking internal short circuits, as discussed with reference to FIG. 11. As may be observed in FIG. 12, both the time required to reach the CZCP 1210, and the magnitude of the determined self-discharge current 1220 are approximately linear, when plotted in log-log coordinate axes. Accordingly, points in between measured values of the plot 1200 may be relatively simply interpolated, and points outside the range covered by the measured values may be relatively simply extrapolated.

As non-limiting examples, application of the various modeling methods previously described can be extended to support the analysis of data produced under test conditions represented in FIG. 11 and FIG. 12. As such, the impact of quick and accurate modeling determination of test current $I_{TEST}$ and related current zero-crossing points will be to accelerate identification of linear relationships (per FIG. 12) that can be used to interpolate within or extrapolate outside known data to other conditions of interest.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed by the disclosure.

What is claimed is:

1. A method of determining a self-discharge current in an energy storage cell, the method comprising:
applying, with a direct current (DC) voltage source, a constant test voltage to an energy storage cell without an external load connected thereto, the constant test voltage being less than an open-circuit voltage of the energy storage cell at an initial state of charge (SOC) of the energy storage cell;

measuring a test current flowing between the DC voltage source and the energy storage cell until after the test current switches from a negative current to a positive current; and determining, with control circuitry operably coupled to a current measuring device, a self-discharge current of the energy storage cell by analyzing the measured test current, wherein the self-discharge current is indicative of a rate of internal discharge of charge stored by the energy storage cell.

2. The method of claim 1, wherein determining a self-discharge current of the energy storage cell by analyzing the measured test current comprises determining the self-discharge current to be about an average of the measured test current taken after the measured test current switches from the negative current to the positive current.

3. The method of claim 1, wherein determining a self-discharge current of the energy storage cell by analyzing the measured test comprises computing a slope of a line approximating an accumulated charge of the energy storage cell with respect to time taken after a minimum value of the cumulative charge is reached.

4. The method of claim 1, wherein applying a constant test voltage to an energy storage cell at an initial SOC of the energy storage cell comprises applying the constant test voltage at SOC of fully charged energy storage cell.

5. The method of claim 1, wherein applying a constant test voltage to an energy storage cell at an initial SOC of the energy storage cell comprises applying the constant test voltage to the energy storage cell at a SOC less than SOC for a fully charged cell.

6. The method of claim 1, wherein applying a constant test voltage to an energy storage cell comprises applying the constant test voltage to the energy storage cell, wherein the constant test voltage is about 0.2 to 20 millivolts less than the open-circuit voltage of the energy storage cell.

7. The method of claim 1, further comprising controlling an environmental temperature of the energy storage cell to be similar to an expected operational temperature of the energy storage cell while applying the constant test voltage and measuring the test current.

8. The method of claim 1, further comprising determining that the energy storage cell has developed at least one of an internal soft short circuit or an internal hard short circuit responsive to determining that the determined self-discharge current of the energy storage cell is greater than a previously determined self-discharge current by a predetermined threshold.

9. The method of claim 8, wherein determining that the energy storage cell has developed at least one of an internal soft short circuit or an internal hard short circuit comprises determining that the determined self-discharge current of the energy storage cell is greater than the previously determined self-discharge current by at least about an order of magnitude.

10. The method of claim 8, further comprising indicating, with a user interface operably coupled to the control circuitry, that the energy storage cell has developed at least one of an internal soft short circuit or an internal hard short circuit.

11. A system for determining a self-discharge current of one or more energy storage cells, the system comprising:

a direct current (DC) voltage source configured to provide a constant test voltage to one or more energy storage cells without an external load connected thereto, the constant test voltage selected to be less than an open circuit voltage of the one or more energy storage cells;

a current measuring device operably coupled between the DC voltage source and the one or more energy storage cells and configured to measure a test current flowing between the DC voltage source and the one or more energy storage cells;

control circuitry operably coupled to the current measuring device and configured to determine a self-discharge current of the one or more energy storage cells by analyzing the test current measured by the current measuring device, wherein the self-discharge current is indicative of a rate of internal discharge of charge stored by the energy storage cell; and a user interface configured to indicate at least one of the determined self-discharge current of the one or more energy storage cells and a health parameter of the one or more energy storage cells generated from the determined self-discharge current determined by the control circuitry.

12. The system of claim 11, further comprising the one or more energy storage cells.

13. The system of claim 12, wherein the one or more energy storage cells include a plurality of energy storage cells, at least one of the plurality of energy storage cells operably coupled in parallel with at least another of the plurality of energy storage cells.

14. The system of claim 12, wherein the one or more energy storage cells include a plurality of energy storage cells, at least one of the plurality of energy storage cells operably coupled in series with at least another of the plurality of energy storage cells.

15. The system of claim 12, wherein the one or more energy storage cells include at least one of a lithium-ion, a lithium metal, a sodium-ion, a lead acid, a nickel-cadmium, and a nickel metal hydride energy storage cell.

16. The system of claim 11, further comprising a battery-powered device including the one or more energy storage cells, the DC voltage source, the current measuring circuitry, the control circuitry, and the user interface.

17. The system of claim 16, wherein the battery-powered device includes a battery-powered device selected from the group consisting of an electric-drive vehicle, an electric grid service, and a consumer electronic device.

18. The system of claim 11, wherein the health parameter of the one or more energy storage cells includes an indication that at least one of the one or more energy storage cells should be replaced responsive to a determination, based at least in part upon the determined self-discharge current, that the at least one of the one or more energy storage cells includes at least one of an internal soft short circuit or an internal hard short circuit.

19. The system of claim 11, wherein the health parameter of the one or more energy storage cells includes an indication that at least one of a short-circuit or a nascent dendrite has formed in the energy storage cell responsive to a change in a determined metric determined by analyzing the test current measured by the current measuring device.

20. The system of claim 19, wherein the determined health metric includes at least one of the determined-self-discharge current, a length of time required for the test current to reach a zero-crossing point, and a determined internal short-circuit resistance.

21. A method of determining a self-discharge current of an energy storage cell, the method comprising:

applying, with a direct current (DC) voltage source, a constant test voltage to an energy storage cell without an external load connected thereto, the constant test voltage selected to be less than an open-circuit voltage of an energy storage cell;

measuring a test current flowing between the DC voltage source and the energy storage cell at least until after the test current switches from a negative current to a positive current flowing from the DC voltage source to the energy storage cell; and determining, with control circuitry operably coupled to a current measuring device, a self-discharge current of the energy storage cell by analyzing the measured test current wherein the self-discharge current is indicative of a rate of internal discharge of charge stored by the energy storage cell.

22. The method of claim 21, wherein determining a self-discharge current of the energy storage cell by analyzing the measured test current source comprises analyzing the measured test current with a sigmoidal-type model that accounts for multiple physical processes in the cell during test periods.

23. The method of claim 22, wherein determining a self-discharge current of the energy storage cell by analyzing the measured test current comprises using a sigmoidal-type model with which to perform a numeric regression on data points corresponding to the test current measured between a time that the constant test voltage is applied to the energy storage cell and a time that the test current switches from negative current to positive current, thereby shortening the time required to determine the self-discharge current of the energy storage cell.

24. The method of claim 21, wherein analyzing the measured test current is performed with a sigmoidal-type model that covers potentiostatic conditions.

25. The method of claim 21, wherein determining a self-discharge current of the energy storage cell by analyzing the measured test current comprises determining a magnitude of the self-discharge current to be the same as a magnitude that the test current settles to after the test current switches from the negative current to the positive current.

26. The method of claim 21, further comprising determining a change in state of charge (SOC) of the energy storage cell by numerically integrating a mathematical model expression estimating the test current over time to determine a net amount of energy lost by the energy storage cell.

27. The method of claim 21, further comprising the use of a mathematical model and a reference value for self-discharge current for predicting the self-discharge current of the energy storage cell for arbitrarily-chosen conditions of the energy storage cell.

28. The method of claim 27, wherein predicting the self-discharge current of the energy storage cell for arbitrarily-chosen conditions of the energy storage cell comprises predicting the self-discharge current of the energy storage cell for at least one condition of the energy storage cell, wherein the at least one condition is selected from the group consisting of cell chemistry, state of charge, age of cell, and cell temperature.

29. The method of claim 21, wherein determining a self-discharge current of the energy storage cell by analyzing the measured test current source comprises diagnostic analysis of the measured test current with a mathematical model, and identifying parameters of the mathematical model that have at least one of a physical, a chemical, a kinetic, and a material basis that contributes to behavior of the self-discharge current of the energy storage cell.

30. The method of claim 21, wherein determining a self-discharge current is performed for multiple interconnected cells of arbitrarily chosen cell-to-cell configuration.

31. The method of claim 21, further comprising determining key quantities related to self-discharge current for use within battery management and control systems, wherein the monitoring and control of operational conditions and diagnostic determination of the battery state of use and health are continuously performed, such that real-time management actions are facilitated.

\* \* \* \* \*